United States Patent
Sato et al.

(10) Patent No.: US 8,637,819 B2
(45) Date of Patent: Jan. 28, 2014

(54) CROSS-SECTION PROCESSING AND OBSERVATION APPARATUS

(71) Applicant: Hitachi High-Tech Science Corporation, Tokyo (JP)

(72) Inventors: Makoto Sato, Tokyo (JP); Tatsuya Asahata, Tokyo (JP); Hidekazu Suzuki, Tokyo (JP)

(73) Assignee: Hitachi High-Tech Science Corporation (JP)

( * ) Notice: Subject to any disclaimer, the term of this patent is extended or adjusted under 35 U.S.C. 154(b) by 0 days.

(21) Appl. No.: 13/842,404

(22) Filed: Mar. 15, 2013

(65) Prior Publication Data

US 2013/0248710 A1 Sep. 26, 2013

(30) Foreign Application Priority Data

Mar. 23, 2012 (JP) ................. 2012-068022

(51) Int. Cl.
*H01J 3/12* (2006.01)
*H01J 37/30* (2006.01)
*H01J 37/31* (2006.01)

(52) U.S. Cl.
USPC ........... 250/306; 250/310; 250/307; 250/398; 250/396 R; 250/491.1; 250/492.2

(58) Field of Classification Search
USPC .......... 250/306, 310, 397, 398, 396 R, 491.1, 250/492.2
See application file for complete search history.

(56) References Cited

U.S. PATENT DOCUMENTS

| 6,538,249 B1 * | 3/2003 | Takane et al. ................... 850/9 |
| 2009/0134327 A1 * | 5/2009 | Ikku et al. ...................... 250/307 |
| 2011/0052044 A1 * | 3/2011 | Takahashi et al. ............ 382/154 |

FOREIGN PATENT DOCUMENTS

JP 2011054497 3/2011

* cited by examiner

*Primary Examiner* — Nikita Wells
(74) *Attorney, Agent, or Firm* — Adams & Wilks

(57) ABSTRACT

Provided is a cross-section processing and observation apparatus, including a control portion for repeatedly executing a process including slice processing by an ion beam and acquisition of a SIM image by a secondary electron emitted from a cross-section formed by the slice processing, in which the control portion divides an observation image into a plurality of areas, and finishes the process when a change has occurred between an image in one area of the plurality of areas and an image in an area, which corresponds to the one area, of an observation image of another cross-section acquired by the process.

6 Claims, 6 Drawing Sheets

CROSS-SECTION PROCESSING AND OBSERVATION APPARATUS

CROSS-SECTION PROCESSING AND OBSERVATION APPARATUS

This application claims priority from Japanese Patent Application No. 2012-068022 filed on Mar. 23, 2012, the entire subject-matter of which is incorporated herein by reference.

BACKGROUND OF THE INVENTION

1. Field of the Invention

The present invention relates to a cross-section processing and observation apparatus for performing cross-section processing and observation of a sample.

2. Description of the Related Art

As a method of analyzing internal structure and defects in a semiconductor device or the like, there is known a cross-section processing and observation method, in which a focused ion beam is used for cross-section processing of a sample to expose a cross-section including a desired structure or a defect and a scanning electron microscope is used to observe the cross-section. According to this method, a desired observation target inside the sample can be exposed with pinpoint accuracy, and hence the structure or the defect can be observed quickly.

A method of performing cross-section processing and cross-section observation by a focused ion beam is also disclosed (see JP-A-2011-54497). According to this method, cross-section processing and observation can be performed even by an apparatus not including a scanning electron microscope.

In recent years, there has been known a technology of combining a plurality of cross-sectional observation images acquired by cross-section processing and observation to construct a three-dimensional image of a region subjected to etching by cross-section processing. In order to construct a high density three-dimensional image, several tens to several hundreds of observation images are acquired and combined to construct a three-dimensional image. Therefore, an apparatus that automatically performs a process of cross-section processing and observation has been necessary.

In the case of automatically performing the process of cross-section processing and observation, the process needs to be finished when a desired observation target is exposed in a cross-section. As a method of monitoring the end point of the process, for example, there is known a method of recognizing an acquired observation image and finishing the process when a desired observation target has appeared in the observation image.

However, in the case of a sample in which a device pattern appears in the cross-section such as a semiconductor device, the shape of the device pattern changes in every observation image, and hence a change in the shape of the device pattern may be recognized by mistake as the appearance of an observation target. Thus, it has been difficult to monitor the process end point.

SUMMARY OF THE INVENTION

Illustrative aspects of the present invention provide a cross-section processing and observation apparatus capable of performing automatic cross-section processing and observation, in which cross-section processing and observation are finished when a desired observation target is exposed in a cross-section.

According to one illustrative aspect of the present invention, there is provided a cross-section processing and observation apparatus, including: a sample stage configured to place a sample thereon; a focused ion beam column configured to irradiate the sample with a focused ion beam; a charged particle detector configured to detect a charged particle emitted from the sample by irradiation of the focused ion beam; and a control portion configured to repeatedly execute a process comprising slice processing of slicing the sample by the focused ion beam and acquisition processing of acquiring an observation image by the charged particle emitted from a cross-section of the sample formed by the slice processing, in which the control portion is configured to divide the observation image into a plurality of areas, and the control portion is configured to finish the process when a change has occurred between an image in one area of a plurality of areas of a first observation image of one cross-section of the sample acquired by one processing and observation process and an image in an area, which corresponds to the one area, of a plurality of areas of a second observation image of another cross-section of the sample acquired by another processing and observation process.

With this configuration, the process end point can be monitored from an observation image even in the case of cross-section processing and observation of a sample in which the shape of a device pattern to be exposed in a cross-section changes in every observation image such as a semiconductor device.

According to the cross-section processing and observation apparatus of the present invention, it is possible to perform automatic cross-section processing and observation, in which cross-section processing and observation are finished when a desired observation target is exposed in a cross-section.

DETAILED DESCRIPTION

A cross-section processing and observation apparatus according to an embodiment of the present invention will be described below.

Figure 1:
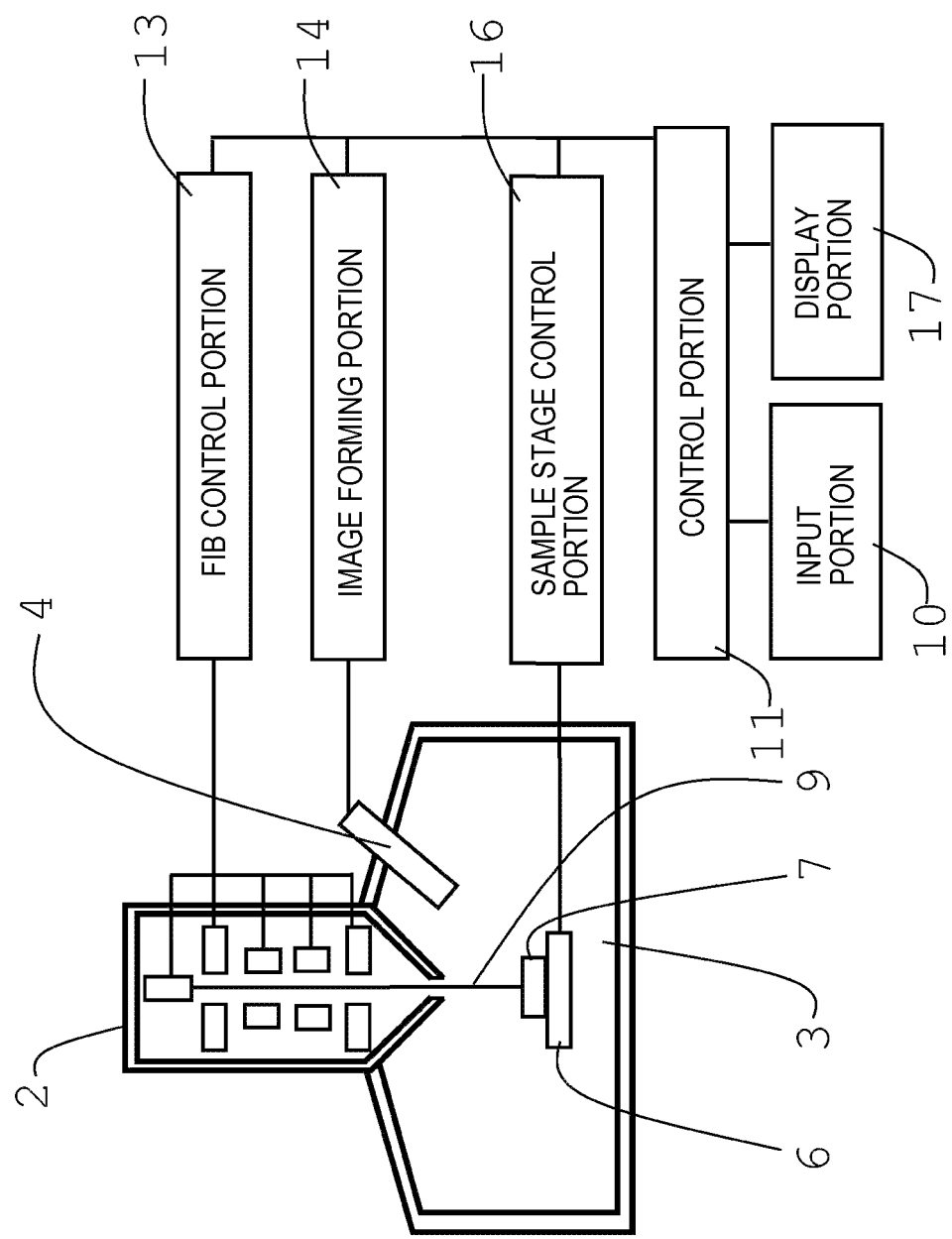
FIG. 1 is a configuration diagram of a cross-section processing and observation apparatus according to an embodiment of the present invention.

As illustrated in FIG. 1, the cross-section processing and observation apparatus in this embodiment includes a FIB column 2 and a sample chamber 3. The FIB column 2 irradiates a sample 7 accommodated in the sample chamber 3 with an ion beam 9.

The cross-section processing and observation apparatus includes a secondary electron detector 4 as a charged particle detector. The secondary electron detector 4 is capable of detecting secondary electrons generated from the sample 7 by irradiation of the ion beam 9.

The cross-section processing and observation, apparatus includes a sample stage 6 for placing the sample 7 thereon. The sample stage 6 can be tilted to change an incident angle of the ion beam 9 to the sample 7. The tilt of the sample stage 6 is controlled by a sample stage control portion 16.

The cross-section processing and observation apparatus includes a FIB control portion 13, an image forming portion 14, and a display portion 17. The FIB control portion 13 transmits an irradiation signal to the FIB column 2 to control the FIB column 2 to radiate the ion beam 9. The image forming portion 14 forms data of a SIM image based on a signal for scanning the ion beam 9 sent from the FIB control portion 13 and a signal of the secondary electrons detected by the secondary electron detector 4. The display portion 17 is capable of displaying the SIM image.

The cross-section processing and observation apparatus includes an input portion 10 and a control portion 11. When an operator inputs information on the start of cross-section processing and observation to the input portion 10, the input portion 10 transmits a signal for starting a process of automatic cross-section processing and observation to the control portion 11. The control portion 11 executes an algorithm of the automatic cross-section processing and observation.

Figure 2A:
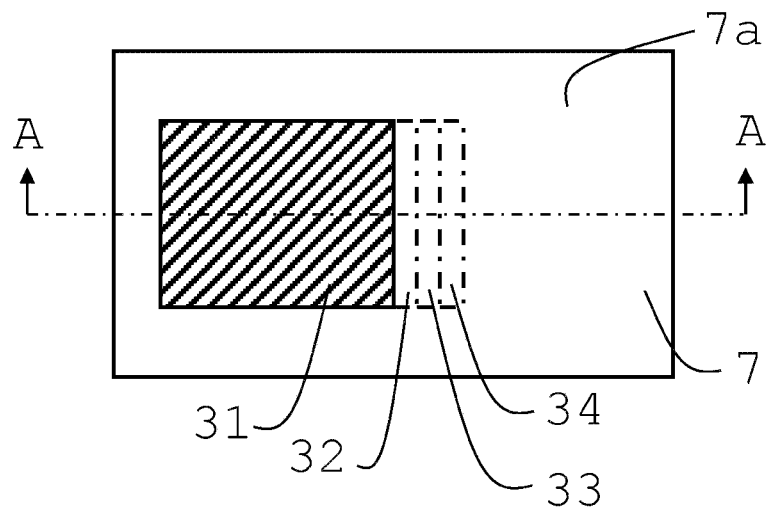
FIGS. 2A and 2B are explanatory diagrams of cross-section processing and observation according to the embodiment of the present invention.
Figure 2B:
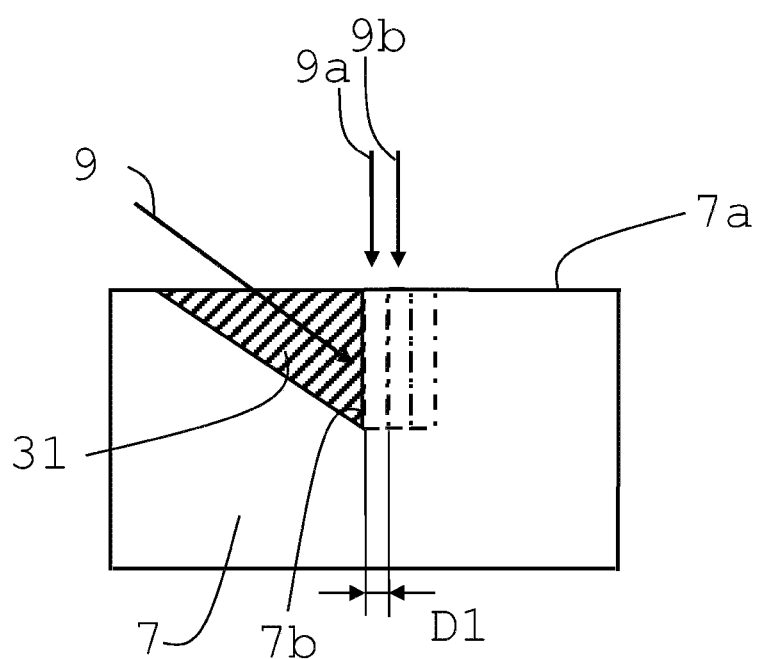

The process of the automatic cross-section processing and observation will be described with reference to FIGS. 2A to 5B. For the preparation of the process, as illustrated in FIG. 2A, a processing groove 31 is formed in the sample 7 such that a cross-section may be irradiated with the ion beam 9 for observing the cross-section. A surface 7a of the sample 7 is scanned and irradiated with the ion beam 9 to form the processing groove 31 by etching processing. FIG. 2B is a cross-sectional diagram taken along the line A-A of FIG. 2A. The processing groove 31 is formed into a slope shape such that a cross-section 7b may be scanned and irradiated with the ion beam 9. The slope shape can reduce the amount of etching and shorten processing time as compared with the case of forming a concave groove.

The control portion 11 executes the algorithm of the automatic cross-section processing and observation. The control portion 11 controls the FIB control portion 13 and the image forming portion 14 to repeatedly execute slice processing and observation of a cross-section exposed by the slice processing. In other words, a sliced region 32 is scanned and irradiated with an ion beam 9a to perform etching processing, and a cross-section exposed by the processing is scanned and irradiated with the ion beam 9 to acquire a SIM image. Next, a sliced region 33 is scanned and irradiated with an ion beam 9b to perform etching processing so that the next cross-section is exposed to acquire a SIM image. In this manner, SIM images of a plurality of cross-sections can be acquired at an interval of a width D1 of the sliced region.

Figure 3A:
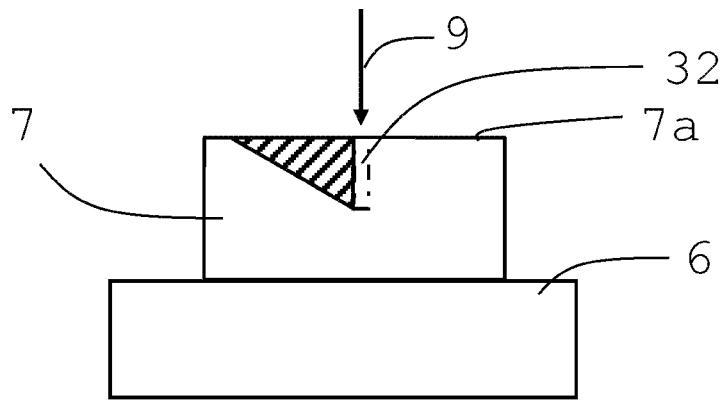
FIGS. 3A to 3C are explanatory diagrams of the cross-section processing and observation according to the embodiment of the present invention.
Figure 3B:
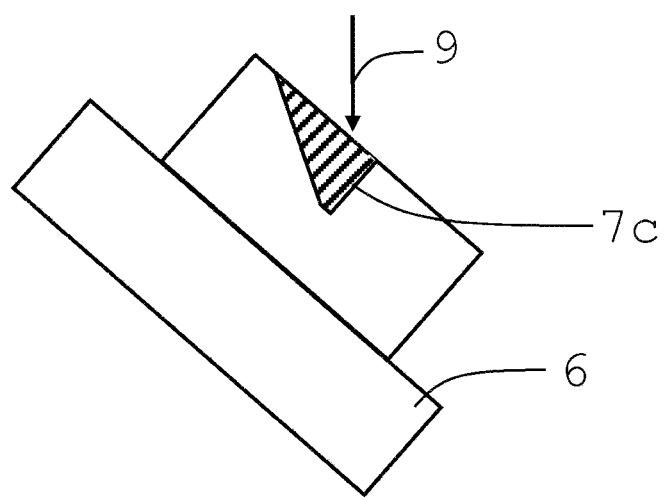
Figure 3C:
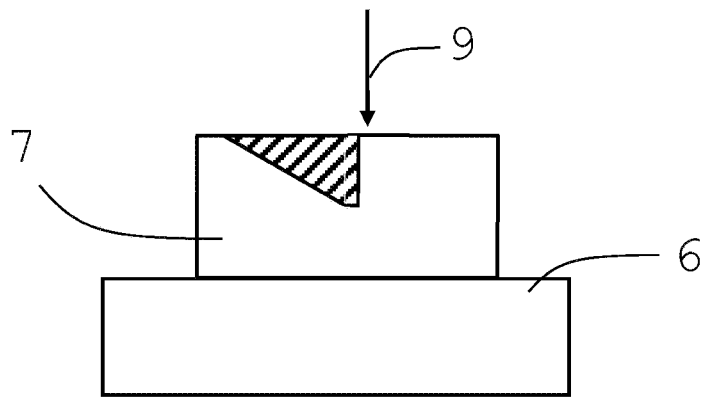

Referring to FIGS. 3A to 3C, the operation of the sample stage 6 during the process will be described. The control portion 11 controls the sample stage control portion 16 to repeatedly tilt the sample stage 6.

In slice processing, the sample stage 6 is set such that the surface 7a of the sample 7 may be perpendicular to the ion beam 9 as illustrated in FIG. 3A. Then, the sliced region 32 is irradiated with the ion beam 9 to perform etching processing.

Next, in order to acquire an observation image, the sample stage 6 is tilted such that a cross-section 7c formed by the slice processing may be irradiated with the ion beam 9 as illustrated in FIG. 3B. In this state, the cross-section 7c is scanned and irradiated with the ion beam 9, and secondary electrons generated are detected to acquire an observation image of the cross-section 7c.

Next, in order to perform slice processing again, the sample stage 6 is set again such that the surface 7a of the sample 7 may be perpendicular to the ion beam 9 as illustrated in FIG. 3C. Then, the next slice processing is performed.

The above-mentioned process is repeatedly performed, to thereby acquire a plurality of observation images.

Description is given of process end point monitoring. The control portion 11 performs the following processing on the observation image formed by the image forming portion 14, and finishes the process when the end point is monitored.

Figure 4A:
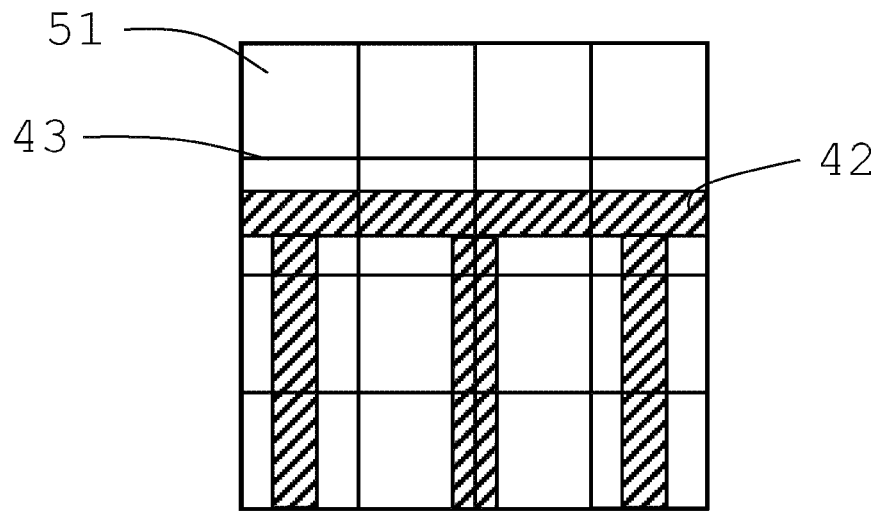
FIGS. 4A and 4B are further explanatory diagrams of the cross-section processing and observation according to the embodiment of the present invention.

FIG. 4A is a SIM image 51 of the acquired cross-section. In the SIM image 51, a device pattern 42 appears. The control portion 11 divides the SIM image 51 into a plurality of areas by division lines 43.

Figure 4B:
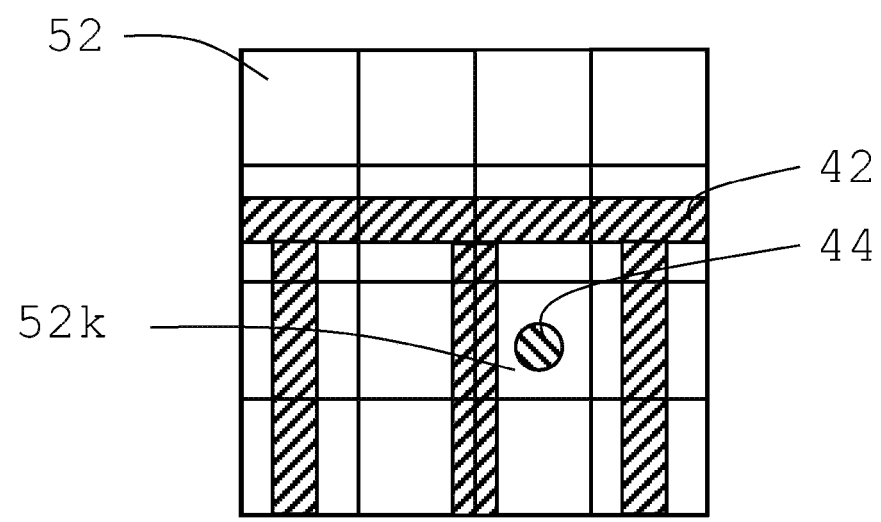

FIG. 4B is a SIM image 52 acquired by continuing slice processing. A defect 44 appears in an area 52k. In response thereto, the control portion 11 recognizes that an image in only one area of the SIM image 52 has changed. The control portion 11 finishes the process at that point. In this manner, the process can be finished when a desired observation target (the defect 44 in this case) is exposed in the cross-section.

A semiconductor device has various shapes, and hence the shape of the device pattern to be exposed in the cross-section changes during the process. In order to prevent the change in the device pattern from being recognized by mistake as the appearance of an observation target, the control portion 11 does not finish the process when image changes are detected in a plurality of areas.

Figure 5A:
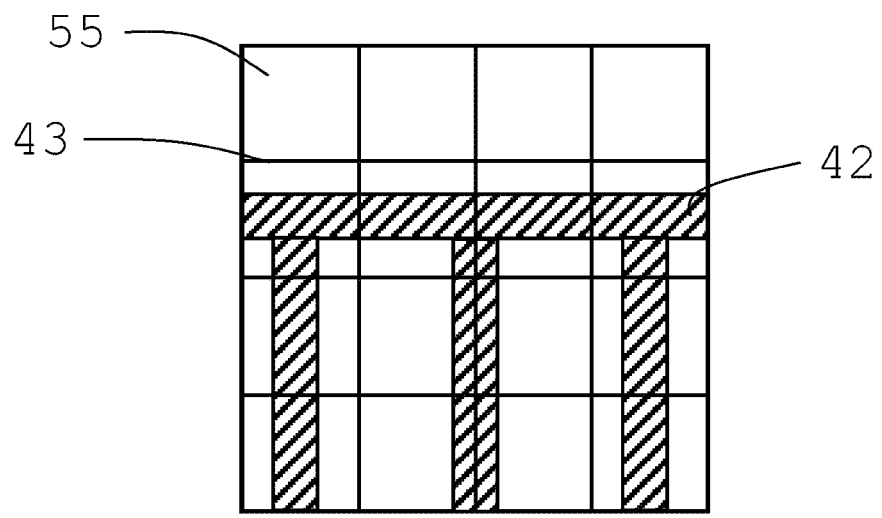
FIGS. 5A and 5B are still further explanatory diagrams of the cross-section processing and observation according to the embodiment of the present invention.
Figure 5B:
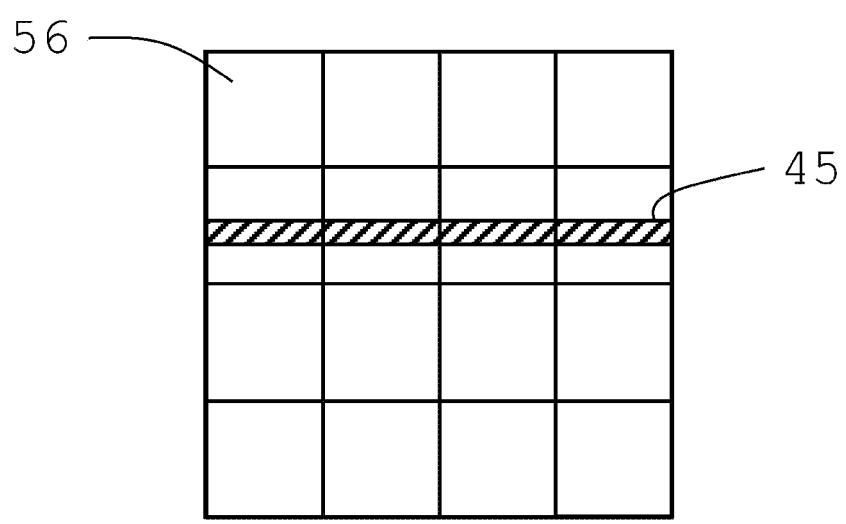

FIG. 5A is a SIM image 55 of the acquired cross-section. In the SIM image 55, a device pattern 42 appears. The control portion 11 divides the SIM image 55 into a plurality of areas by division lines 43. FIG. 5B is a SIM image 56 acquired by continuing slice processing. A device pattern 45 whose shape is different from that of the device pattern 42 appears. In the SIM image 56, an image has changed in a plurality of areas as compared with the SIM image 55. In this case, the control portion 11 does not finish the process. After that, in a case where a defect appears and the control portion 11 recognizes that an image in only one area of a SIM image, which is acquired by further continuing slice processing, has changed, the control portion 11 finishes the process at that point.

With this configuration, the cross-section processing and observation apparatus can monitor the process end point from an observation image even in the case of cross-section processing and observation of a sample in which the shape of a device pattern changes in every observation image such as a semiconductor device.

Next, a cross-section processing and observation apparatus according to another embodiment of the present invention will be described.

Figure 6:
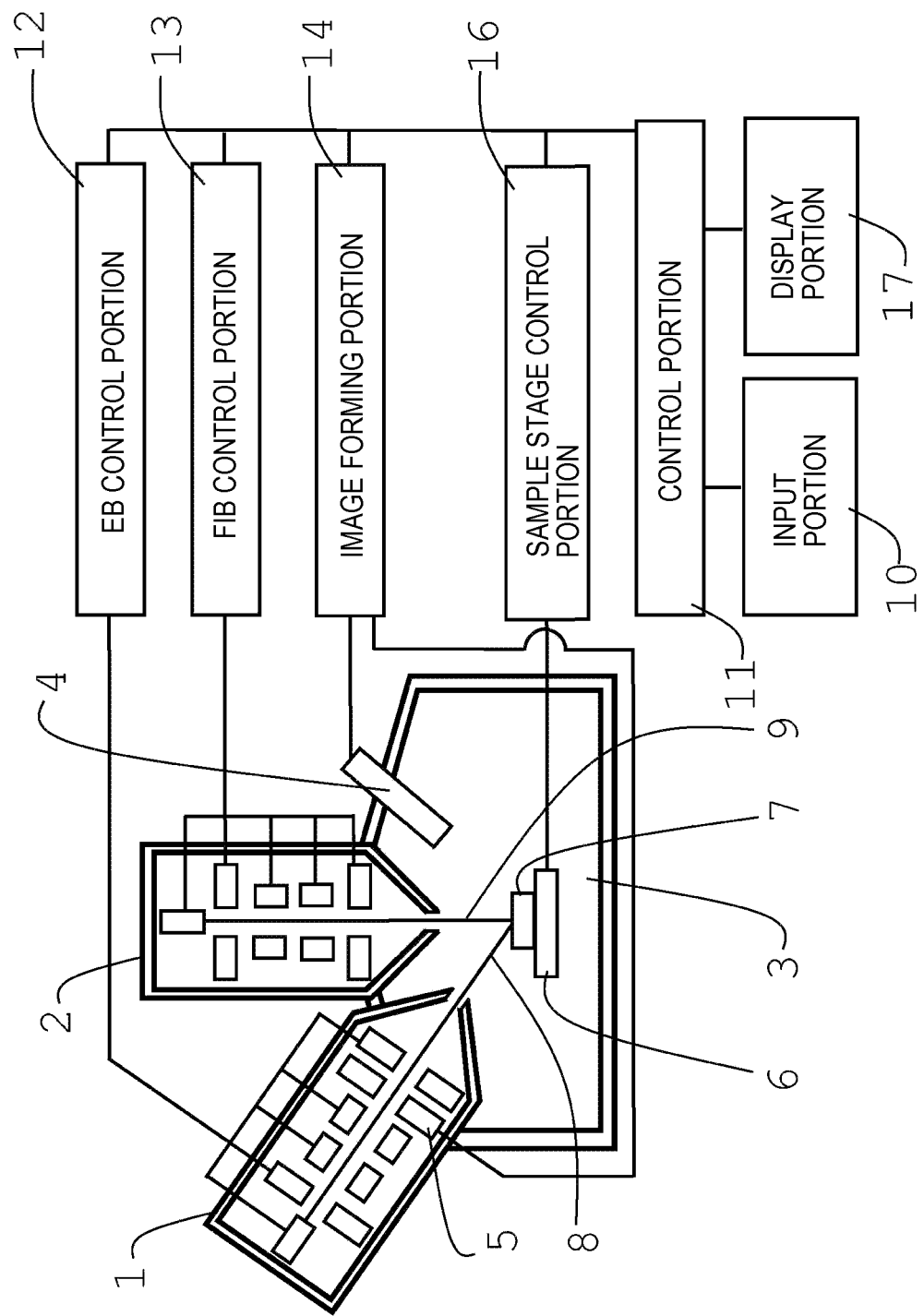
FIG. 6 is a configuration diagram of a cross-section processing and observation apparatus according to another embodiment of the present invention.

The cross-section processing and observation apparatus in this embodiment includes, in addition to the above-mentioned cross-section processing and observation apparatus, an EB column 1 for irradiating the sample 7 with an electron beam 8 as illustrated in FIG. 6.

The cross-section processing and observation apparatus includes the secondary electron detector 4 and a backscattered electron detector 5 as charged particle detectors. The secondary electron detector 4 is capable of detecting secondary electrons generated from the sample 7 by irradiation of the electron beam 8 or the ion beam 9. The backscattered electron detector 5 is provided inside the EB column 1. The backscattered electron detector 5 is capable of detecting backscattered electrons reflected by the sample 7 as a result of the irradiation of the electron beam 8 to the sample 7.

The cross-section processing and observation apparatus further includes an EB control portion 12, the FIB control portion 13, the image forming portion 14, and the display portion 17. The EB control portion 12 transmits an irradiation signal to the EB column 1 to control the EB column 1 to radiate the electron beam 8. The FIB control portion 13 transmits an irradiation signal to the FIB column 2 to control the FIB column 2 to radiate the ion beam 9. The image forming portion 14 forms a backscattered electron image based on a signal for scanning the electron beam 8 sent from the EB control portion 12 and a signal of the backscattered electrons detected by the backscattered electron detector 5. The display portion 17 is capable of displaying the backscattered electron image. The image forming portion 14 forms data of a SEM image based on the signal for scanning the electron beam 8 sent from the EB control portion 12 and a signal of the secondary electrons detected by the secondary electron detector 4. The display portion 17 is capable of displaying the SEM image. Further, the image forming portion 14 forms data of a SIM image based on a signal for scanning the ion beam 9 sent from the FIB control portion 13 and a signal of the secondary electrons detected by the secondary electron detector 4. The display portion 17 is capable of displaying the SIM image.

According to this embodiment, the cross-section formed by the ion beam 9 in slice processing can be irradiated with the electron beam 8 without tilting the sample stage 6, and the SEM image can be acquired as an observation image. Therefore, as compared with a cross-section processing and observation apparatus not including the EB column 1, the cross-section processing and observation can be performed in a shorter period of time.

What is claimed is:

1. A cross-section processing and observation apparatus, comprising:
    a sample stage configured to place a sample thereon;
    a focused ion beam column configured to irradiate the sample with a focused ion beam;
    a charged particle detector configured to detect a charged particle emitted from the sample by irradiation of the focused ion beam; and
    a control portion configured to repeatedly execute a processing and observation process comprising:
        slice processing of slicing the sample by the focused ion beam; and
        acquisition processing of acquiring an observation image by the charged particle emitted from a cross-section of the sample formed by the slice processing,
    wherein the control portion is configured to divide the observation image into a plurality of areas, and
    wherein the control portion is configured to finish the process when a change has occurred between an image in one area of a plurality of areas of a first observation image of one cross-section of the sample acquired by one processing and observation process and an image in an area, which corresponds to the one area, of a plurality of areas of a second observation image of another cross-section of the sample acquired by another processing and observation process.

2. The cross-section processing and observation apparatus according to claim 1,
    wherein the control portion is configured not to finish the process when changes have occurred between images in two or more areas of the first observation image and images in areas of the observation image, which corresponds to the two or more areas, of the second observation image.

3. The cross-section processing and observation apparatus according to claim 1,
    wherein the control portion is configured to tilt the sample stage in order to perform the slice processing and the acquisition processing by the focused ion beam.

4. The cross-section processing and observation apparatus according to claim 2,
    wherein the control portion is configured to tilt the sample stage in order to perform the slice processing and the acquisition processing by the focused ion beam.

5. The cross-section processing and observation apparatus according to claim 1, further comprising:
    an electron beam column for irradiating the cross-section with an electron beam,
    wherein the observation image comprises an observation image acquired by one of a secondary electron and a backscattered electron generated by irradiation of the electron beam.

6. The cross-section processing and observation apparatus according to claim 2, further comprising:
    an electron beam column configured to irradiate the cross-section with an electron beam,
    wherein the observation image comprises an observation image acquired by one of a secondary electron and a backscattered electron generated by irradiation of the electron beam.

* * * * *